United States Patent [19]
Busanovich et al.

[11] 3,990,095
[45] Nov. 2, 1976

[54] SELENIUM RECTIFIER HAVING HEXAGONAL POLYCRYSTALLINE SELENIUM LAYER

[75] Inventors: Charles John Busanovich, Princeton, N.J.; Robert Milton Moore, Carmel, Ind.

[73] Assignee: RCA Corporation, New York, N.Y.

[22] Filed: Sept. 15, 1975

[21] Appl. No.: 613,356

[52] U.S. Cl. .................................... 357/15; 357/16; 357/11; 357/31
[51] Int. Cl.² ................. H01L 29/161; H01L 29/48
[58] Field of Search .................. 357/11, 15, 16, 31, 357/30

[56] References Cited
UNITED STATES PATENTS

| | | | |
|---|---|---|---|
| 3,450,967 | 6/1969 | Tohitis | 357/11 |
| 3,473,095 | 10/1969 | Griffiths | 317/241 |
| 3,622,712 | 11/1971 | Moore | 179/100.41 K |
| 3,624,465 | 11/1971 | Moore | 317/235 R |
| 3,755,002 | 8/1973 | Hirai | 148/1.5 |
| 3,800,194 | 3/1974 | Maruyoma | 317/235 R |

*Primary Examiner*—Martin H. Edlow
*Attorney, Agent, or Firm*—Glenn H. Bruestle; Robert J. Boivin

[57] ABSTRACT

A rectifying junction suitable for use in photosensitive devices is fabricated between a polycrystalline selenium layer and an electrode of n-type or low work function metal material.

11 Claims, 3 Drawing Figures

SELENIUM RECTIFIER HAVING HEXAGONAL POLYCRYSTALLINE SELENIUM LAYER

BACKGROUND OF THE INVENTION

The invention relates to selenium rectifiers and more particularly to such structures having junctions employing crystalline selenium which are suitable for use as blocking contact for holes in photosensitive devices.

The electrical characteristics of vitreous selenium and hexagonal selenium (also technically known as "trigonal" selenium) vary considerably as discussed in an article entitled "Some Investigations on the Electrical Properties of Hexagonal Selenium" by L. M. Nijland, in *Phillips Res. Rep.* 9, (1954), pp. 259–294. For example, vitreous selenium at 20° C. is highly resistive, i.e. its resistivity is between $10^{10}$ ohm-cm. and $10^{14}$ ohm-cm., whereas hexagonal selenium is quite conducting and may have a resistivity of from a few hundred ohm-cm. to $10^9$ ohm-cm. depending upon the concentration of halogens, or thallium impurities, respectively.

Nonphotosensitive selenium rectifiers are known which generally consist of a metallic base plate, a layer of hexagonal selenium, a barrier layer along the selenium layer forming a rectifying junction therewith, and a counter electrode. The barrier layer usually consists of cadmium selenide. Such rectifiers are described for example in:

U.S. Pat. No. 2,908,592, issued to H. Strosche on Oct. 13, 1959;

U.S. Pat. No. 3,473,095, issued to G. H. Griffiths on Oct. 14, 1969;

U.S. Pat. No. 3,622,712, issued to R. M. Moore et al. on Nov. 23, 1971 and in

"Electrical Behavior of the Contact Between Cadmium and Single Crystal Selenium Film" by C. H. C. Griffiths and H. Sang in *The Physics of Selenium and Tellurium*, W. C. Cooper Ed., Pergamon Press, Inc., London, England 1969, pp. 349–370.

In contrast to selenium rectifiers, a variety of photosensitive devices such as imaging pickup devices (e.g. camera tubes and electrophotographic plates) have been fabricated having photoconductive layers consisting of the highly resistive vitreous or amorphous form of selenium. Such devices, are for example, described in:

U.S. Pat. No. 3,350,595, issued to W. M. Kramer on Oct. 31, 1967;

U.S. Pat. No. 3,405,298 issued to J. Dressner on Oct. 8, 1968;

U.S. Pat. No. 3,861,913 issued to C. Chiou on Jan. 21, 1975; and

Great Britain Pat. No. 1,343,197 issued to Tanaka et al. and filed on June 14, 1971.

As a consequence of significantly differing application requirements, the prior art relating to selenium rectifiers has not been considered by persons of skill in the art of photosensitive devices as particularly relevant to photosensitive devices. For example, because of the extremely low dark current (e.g. 10nA. at 20 volts) and low forward current requirements of imaging devices, such devices have employed vitreous selenium because of its high resistivity and/or its ability to form a blocking contact with n-type semiconductor materials such as, cadmium selenide, or low work function oxidized metals such as oxidized aluminum. In contrast, nonphotosensitive selenium rectifiers have generally employed the low resistivity hexagonal polycrystalline selenium because of its less critical reverse leakage and higher forward current requirements. In general, hexagonal selenium layers have not been employed in imaging devices because of an inability to control dark or reverse leakage currents associated with its lower resistivity. Furthermore, certain techniques employed in manufacture of selenium rectifiers (e.g. surface roughening employed to obtain adhesion between a polycrystalline selenium layer and an electrode surface) are generally inapplicable to photosensitive devices.

Prior art electrophotographic plates are known having both vitreous and polycrystalline selenium layers in a single multilayered structure. One such structure is described in an article entitled "Advances in Xerography: 1958–1962" by C. J. Claus in *Photographic Science and Engineering*, Vol. 7, No. 1, Jan.–Feb. 1963. The structure therein described includes a tin oxide coating upon which two selenium overlayers are successively disposed. The first overlayer comprises an electron injection photoconductive layer of crystalline selenium and the second comprises a charge storage layer of amorphous selenium. In the operation of the structure as an electrophotographic plate, electron-hole pairs are photogenerated in the first overlayer and the electrons are injected into the highly resistive second layer where the electric field associated with stored surface charges, accelerates them to the surface. The structure described, however, is relatively complex and is not generally adaptable to some imaging devices, such as pickup tubes, requiring a blocking contact for holes.

In general, a thermally stable and easily manufactured rectifying contact is desired which is suitable for incorporation in imaging devices and other photosensitive devices as a blocking contact for holes.

SUMMARY OF THE INVENTION

A rectifier for electrical devices includes a layer of hexagonal polycrystalline selenium and an electrode of an n-type material or low work function metal material in intimate proximity to a surface region of the layer. Between the selenium layer and the electrode, a material region having an effective level of tellurium is disposed whereby a mechanically stable rectifying junction is achieved between the layer and the electrode.

DETAILED DESCRIPTION

Figure 1:
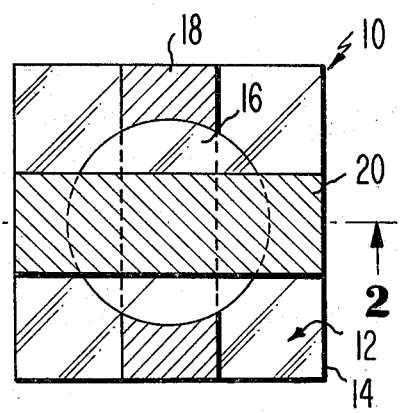
FIG. 1 is a top view of a photodiode fabricated in accordance with the invention.
Figure 2:
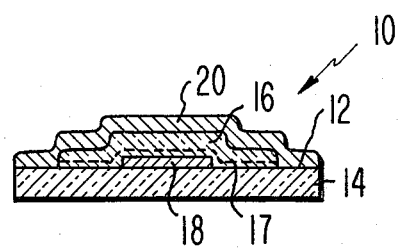
FIG. 2 is a cross-sectional view of the photodiode depicted in FIG. 1 taken along lines 2—2.

Referring to FIGS. 1 and 2 there is shown a photodiode 10, having rectifying capabilities suitable for incorporation into photosensitive devices.

Diode 10 is fabricated along a major surface 12 of a glass substrate 14. In a simplified structure depicted in FIGS. 1 and 2, a layer of polycrystalline hexagonal ("trigonal") selenium 16 is fabricated in sandwich fashion between opposing contacting electrodes 18 and 20. A surface region 17 of the layer 16 which abuts the electrode 18 includes an effective level of tellurium for avoiding peeling and cracking of the layer 16 from the electrode 18.

The electrode 18 may comprise an n-type semiconductor, such as, for example, tin oxide, cadmium oxide, or other n-type semiconductors comprising (i) compounds of materials selected from Group IIIA and VA of the Periodic Table of Elements or (ii) compounds of materials selected from Groups IIA and VIA of the Periodic Table of Elements which are suitable for achieving a semiconductor rectifying junction with the layer 16. Alternatively the electrode 18 may comprise a metal having a "low" work function of less than about 5.0eV. such as, for example, aluminum, cadmium, or indium, and suitable for achieving a Schottky barrier with the layer 16. In the photodiode 10, the electrode 18 preferably comprises a transparent conductive coating such as $SnO_2$.

A thin insulating layer may also be interposed in sandwich fashion between the electrode 18 and the layer 16, to advantage. Such insulating layers could, for example, comprise oxidated surface regions of the material composition of the electrode 18, so long as the thickness of that layer is sufficiently thin to maintain the desired rectifying junction capabilities and thin enough to permit adequate tunneling or injection of electrons through that layer from the selenium layer 16. Thus, while electrode 18 may be in direct abutting contact with the selenium layer 16; it may also be, in a broader sense, "intimately proximate" thereto by the incorporation of another thin layer of material therebetween, such as the insulating layer just described. The electrode 18 must be sufficiently proximate (i.e. intimately proximate) to the layer 16 to form a rectifying junction therewith.

In lieu of tin oxide, electrode 18 could theoretically, for example, consist of aluminum, in which case a thin surface layer of an approximately 25A thickness of aluminum oxide might also be interposed between layer 16 and the electrode 18, to advantage without destroying the rectifying junction disclosed.

Electrode 20 serves as a counter-electrode and makes ohmic contact to the major surface of layer 16 opposite the major surface contacting the electrode 18. Electrode 20 preferably comprises a metal of a high work function above about 5.0eV. Suitable materials for the electrode 20 include, for example, gold, tellurium-gold (Te-Au), or Nickel. The relative thicknesses of electrode 18 and 20 and the layer 20 may vary considerably depending upon the material and the application, and are not generally considered critical.

One embodiment of the diode 10 may be fabricated in the following manner:

An electrode 18 of transparent tin oxide is formed as a thin rectangular strip along the major surface 12 of glass substrate 14 by, for example, chemical vapor deposition techniques well known in the art. Several such techniques are described in the U.S. Pat. No. 3,705,054 issued to T. Matsushita et al. on Dec. 5, 1972. The tin oxide electrode 18 is preferably less than 1 micron thick; however, other thicknesses may be employed depending upon the degree of transparency and conductivity of that electrode desired.

After the deposition of the electrode 18, a thin tellurium layer is formed along the available surface of the electrode 18, by evaporation techniques well known in the art, while maintaining the substrate 11 substantially at room temperature. Preferably, the thickness of the tellurium layer formed is about 30A, however, thicknesses of from about 25A to about 50A may be employed to advantage.

The selenium layer is thereafter formed by evaporation of amorphous or vitreous selenium onto the available surface of the tellurium layer previously deposited. Each of the foregoing steps of evaporating tellurium and selenium should be accomplished in a vacuum of less than about $10^{-4}$ torr, however, vacuum levels of less than $10^{-5}$ torr are preferred.

The vitreous selenium layer is thermally treated by heating the workpiece, for example, in air at a temperature of from about 150° to 180° C. for a period of from about 15 minutes to about 1 hour, thereby causing substantially complete crystallization of that layer to the polycrystalline hexagonal (trigonal) form of selenium as evidenced by its conversion to a gray opaque layer. In general, the crystallization may also be accomplished to advantage in alternative atmospheres such as, for example, helium and/or nitrogen.

During crystallization of the selenium layer, the thin tellurium layer is thought to partially diffuse within the surface region of layer 16 abutting the electrode 18, thus forming a thin region or layer 17 of selenium-tellurium alloy at the interface. An extremely thin film substantially of tellurium remains in contact with the electrode 18, serving as a mechanical buffer region for preventing a characteristic peeling and cracking of the crystalline layer 16 from the electrode 18 during and after the crystallization step. In the aforementioned prior art selenium rectifiers, certain mechanical roughening techniques of the underlying surface of the baseplate was considered necessary for insuring sufficient adhesion of the selenium layer to the metallic base plate for avoiding such cracking and peeling. In contrast, the incorporation of the intermediate tellurium buffer region in the disclosed device avoids the necessity of providing surface discontinuities (e.g., by surface roughening techniques) along the surface of electrode 18 prior to the deposition of the selenium layer 16 to insure the mechanically stable adhession of that overlying layer in the resulting structure. The avoidance of such surface discontinuities is particularly important for imaging devices such as, for example, vidicon pickup tubes where stringent resolution requirements preclude discontinuities having dimensions exceeding about 20 microns.

The thickness of the resulting tellurium thin film may be adjusted by the controlled diffusion of the tellurium layer within the selenium layer 16, so long as an effective thickness of the tellurium film is retained for achieving a mechanically stable contact between the layer 16 and electrode 18.

A rectangular strip of gold, or other high work function metal is evaporated by conventional techniques along the exposed available surface of the selenium layer, thereby forming the counter electrode 20. The electrode 20 provides an ohmic electrical contact to the abutting selenium layer 16.

Figure 3:
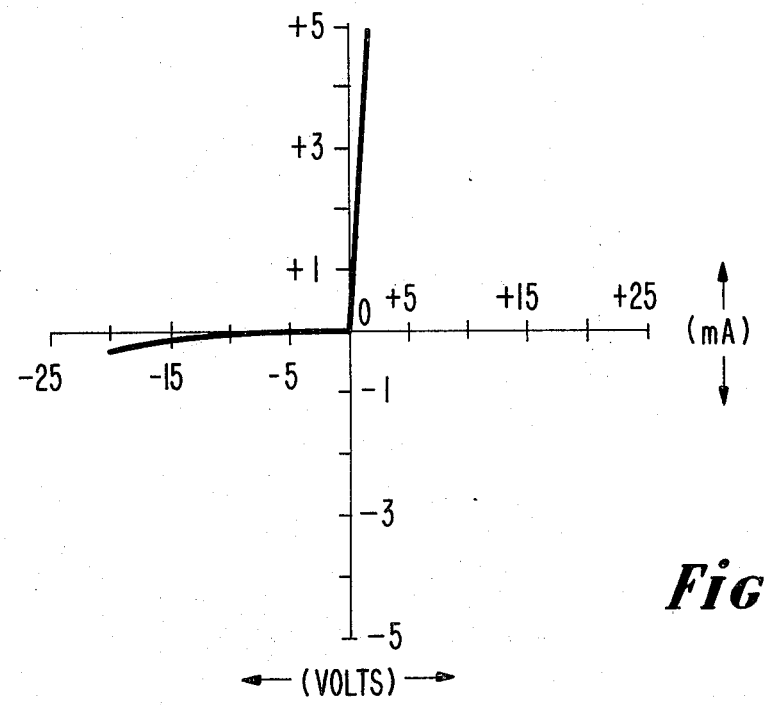
FIG. 3 is a graphical representation of the rectifying electrical characteristics of a photodiode constructed in accordance with the invention.

A rectifying junction is automatically created between the selenium layer 16 and the electrode 18. Typical forward and reverse characteristics of the diode 10 fabricated in the previously described manner and including an active selenium area of about 2 $cm.^2$ between the electrodes 16 and 18, are depicted in FIG. 3. The diode 10 so fabricated, possesses an ability to prevent or block the injection of holes from the electrode 18 into the selenium layer 16, through the junction, since it is reverse biased by the application of a positive electric potential to the electrode 18 and a negative electric potential to the counter electrode 20.

We claim:

1. An electrical device having a rectifying junction comprising:
   an electrode of a material selected from the group consisting of the n type semiconductors and the metals having a low work function below about 5 eV., and
   a layer of hexagonal polycrystalline selenium over said electrode and having a surface region, in intimate proximity to said electrode, including an effective level of tellurium whereby a mechanically stable rectifying junction is achieved between said layer and said electrode; said rectifying junction being reversed biased upon the application of a positive electric potential to said electrode and a negative electric potential to said selenium layer.

2. An electrical device in accordance with claim 1, wherein said electrode consists of tin oxide.

3. An electrical device in accordance with claim 2, wherein a thin film of tellurium is between said electrode and said layer.

4. An electrical device in accordance with claim 3, wherein said thin film is less than about 200A in thickness.

5. An electrical device in accordance with claim 4, wherein said thin film thickness is less than about 50A.

6. An electrical device in accordance with claim 1, wherein said electrode comprises aluminum or oxides thereof.

7. A photosensitive device comprising:
   an electrode of a material selected from the group consisting of the n-type semiconductors and the metals having a low work function below about 5 eV.; and
   a layer of hexagonal polycrystalline selenium over said electrode having a tellurium doped surface region interfacing in intimate proximity with a major facing surface of said electrode and forming therewith a mechanically stable rectifying junction, said rectifying junction being reversed biased upon the application of a positive electric potential to said electrode and a negative electric potential to said selenium layer.

8. A photosensitive device in accordance with claim 7, wherein a thin film of tellurium is between said electrode and said layer.

9. A photosensitive device in accordance with claim 8, wherein said thin film thickness is less than about 200A.

10. A photosensitive device in accordance with claim 9, wherein said thin film thickness is less than about 50A.

11. A photosensitive device in accordance with claim 8, wherein said electrode comprises tin oxide.

* * * * *